(12) United States Patent
Du Bois et al.

(10) Patent No.: US 7,922,440 B2
(45) Date of Patent: Apr. 12, 2011

(54) APPARATUS AND METHOD FOR CENTERING A SUBSTRATE IN A PROCESS CHAMBER

(75) Inventors: Dale R. Du Bois, Los Gatos, CA (US); Ganesh Balasubramanian, Sunnyvale, CA (US); Mark A. Fodor, Los Gatos, CA (US); Chiu Chan, Foster City, CA (US); Karthik Janakiraman, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 314 days.

(21) Appl. No.: 12/171,594

(22) Filed: Jul. 11, 2008

(65) Prior Publication Data
US 2009/0017228 A1    Jan. 15, 2009

Related U.S. Application Data

(60) Provisional application No. 60/949,397, filed on Jul. 12, 2007, provisional application No. 60/982,961, filed on Oct. 26, 2007, provisional application No. 60/982,993, filed on Oct. 26, 2007.

(51) Int. Cl.
*B21B 39/22* (2006.01)
*B65G 47/22* (2006.01)

(52) U.S. Cl. .......... 414/754; 414/780; 414/936; 901/48; 269/58; 269/254 R (58) Field of Classification Search .................. 222/463; 271/220, 221; 294/99.1; 414/217, 217.1, 414/771, 774, 777, 936, 754; 901/48; 269/254 CS, 269/254 R, 305, 315
See application file for complete search history.

(56) References Cited

U.S. PATENT DOCUMENTS

| | | | |
|---|---|---|---|
| 3,466,514 A * | 9/1969 | Brunner et al. | 318/577 |
| 5,871,811 A | 2/1999 | Wang et al. | |
| 5,954,072 A * | 9/1999 | Matusita | 134/149 |
| 6,042,687 A | 3/2000 | Singh et al. | |
| 6,167,893 B1 | 1/2001 | Taatjes et al. | |
| 6,273,484 B1 | 8/2001 | Peng | |
| 6,478,924 B1 | 11/2002 | Shamouilian et al. | |
| 6,986,636 B2 * | 1/2006 | Konig et al. | 414/763 |

FOREIGN PATENT DOCUMENTS
JP    10209249 A  *  8/1998

OTHER PUBLICATIONS

PCT International Search Report and Written Opinion dated Sep. 17, 2008 for International Application No. PCT/US2008/69547.
International Search Report and Written Opinion dated Oct. 9, 2008 for International Application No. PCT/US2008/069545.

* cited by examiner

*Primary Examiner* — Gregory W Adams
(74) *Attorney, Agent, or Firm* — Patterson & Sheridan, LLP (57) ABSTRACT

The present invention comprises an apparatus and method for centering a substrate in a process chamber. In one embodiment, the apparatus comprises a substrate support having a support surface adapted to receive the placement of a substrate and a reference axis substantially perpendicular to the support surface, and a plurality of centering members extending above the support surface. Each centering member is biased into a first position and is movable to a second position by interacting with an opposing member. A movement between the first position and the second position thereby causes each centering member to releasably engage with a peripheral edge of the substrate to push the substrate in a direction toward the reference axis.

20 Claims, 7 Drawing Sheets

APPARATUS AND METHOD FOR CENTERING A SUBSTRATE IN A PROCESS CHAMBER

CROSS-REFERENCE TO RELATED APPLICATIONS

This application claims benefit of U.S. Provisional Patent Application Ser. No. 60/949,397, filed Jul. 12, 2007, U.S. Provisional Patent Application Ser. No. 60/982,961, filed Oct. 26, 2007, and U.S. Provisional Patent Application Ser. No. 60/982,993, filed Oct. 26, 2007. Each of the aforementioned patent applications is herein incorporated by reference.

BACKGROUND OF THE INVENTION

1. Field of the Invention

Embodiments of the invention generally relate to apparatus and methods for processing semiconductor substrates. More particularly, embodiments of the present invention relate to apparatus and methods for centering a substrate in a process chamber.

2. Description of the Related Art

Figure 1A:
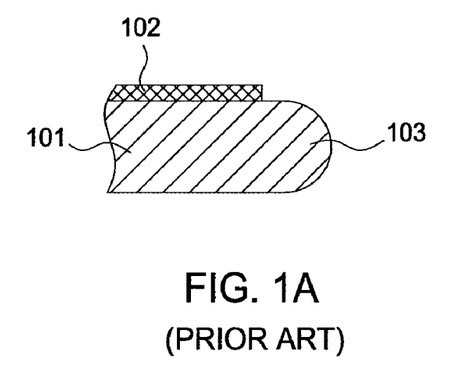
FIG. 1A illustrates a desired profile for a deposition layer at a peripheral region of a substrate.
Figure 1B:
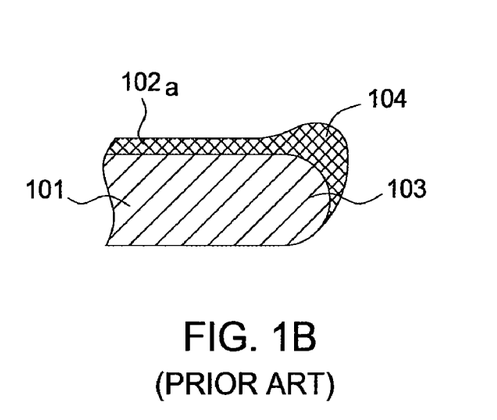
FIG. 1B illustrates a profile actually obtained for a deposition layer at a peripheral region of a substrate.

During a chemical vapor deposition (CVD) or plasma enhanced chemical vapor deposition (PECVD), it is desirable to have a uniform thickness profile across a substrate and no deposition near an edge area of the substrate. The area near the edge where deposition is not desired is generally referred to as the "edge exclusion." FIG. 1A is a partial cross-sectional view showing the desired profile for a deposition layer 102 formed on a substrate 101. The deposition layer 102 is uniformly deposited across a top surface of the substrate 101 and there is no deposition within an edge exclusion area 103. Unfortunately, an actual deposition profile generally differs from the ideal configuration illustrated in FIG. 1A. FIG. 1B is a partial cross-sectional view showing an actual surface profile of a deposition layer 102a on the substrate 101 after having undergone a CVD or PECVD deposition. The deposition layer 102a typically extends to the edge exclusion area 103, and a bevel edge 104 with extra thickness may be formed near the edge exclusion area 103.

Figure 1C:
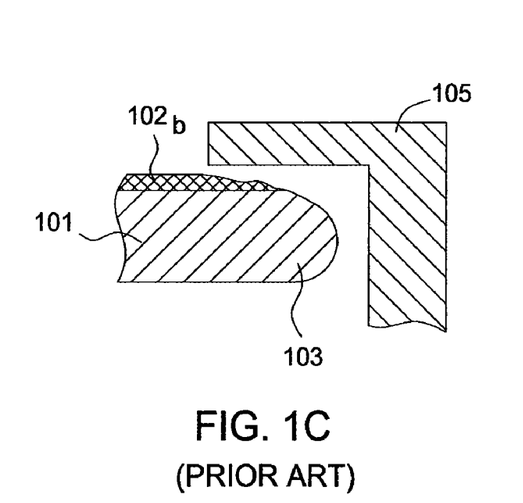
FIG. 1C illustrates one conventional approach using a shadow ring to prevent the formation of a deposition film at the peripheral region of the substrate.

To prevent the formation of the deposition film at the edge of the substrate, FIG. 1C is a partial cross-sectional view showing one conventional approach that proposes to use a shadow ring 105. The shadow ring 105 is usually arranged at a location that overlaps and covers at least one portion of the edge exclusion area 103 of the substrate 101. As a result, as shown in FIG. 1C, a deposition layer 102b gradually reduces under the shadow of the shadow ring 105.

While the use of the shadow ring 105 can currently achieve thickness uniformity up to a 3.5 mm-wide edge exclusion area, the requirement for thickness non-uniformity has to be reduced to a 2 mm-wide edge exclusion area owing to increasingly shrinking device dimensions. As a result of the smaller edge exclusion area, a more accurate placement of the substrate 101 is required. In particular, regarding the approach using the shadow ring 105, the substrate 101 have to be placed substantially centered on the center axis of the shadow ring 105 so that the edge exclusion area 103 is correctly covered.

Therefore, there is a need for a mechanism that can center the position of the substrate in the process chamber in a cost effective and accurate manner.

SUMMARY OF THE INVENTION

The present invention comprises an apparatus for centering a substrate in a process chamber and its fabrication method.

One embodiment provides an apparatus for positioning a substrate in a processing chamber comprising a substrate support having a support surface adapted to receive the substrate, and a plurality of centering members configured to center the substrate relative to a reference axis substantially perpendicular to the support surface, wherein the plurality of the centering members are movably disposed along a periphery of the support surface, and each of the plurality of centering members comprises a first end portion configured to contact a periphery edge of the substrate, wherein the first end portion is movable between a first position and a second position, a movement from the first position to the second position causes the centering member to release the peripheral edge of the substrate, and a movement from the second position to the first position causes the centering member to push the substrate in a direction toward the reference axis.

Another embodiment provides a method for centering a substrate in a processing chamber comprising providing a substrate support having a support surface adapted to receive a substrate, providing a plurality of centering members disposed along a circle centered at a reference axis substantially perpendicular to the support surface, wherein each centering member comprises an end portion configured to contact a periphery edge of a substrate, and the end portion is radially movable towards and away from the reference axis, moving the end portion of each centering members radially outwards and away from the reference axis, placing the substrate on the substrate support, wherein the substrate and the centering members do not contact, moving the end portion of each centering members to radially inwards to contact with a peripheral edge of the substrate for centering the substrate, and positioning the substrate with the end portions of the centering members.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments described herein relate to an apparatus and method for centering a substrate that are applicable for various chamber systems configured to apply diverse semiconductor processes on a substrate. Although the embodiments are exemplarily described for use in a deposition chamber, some embodiments may be applicable for other types of process chambers that necessitate centering a substrate. Examples include, without limitations, loadlock chambers, testing chambers, deposition chambers, etching chambers, and thermal treatment chambers.

Figure 2:
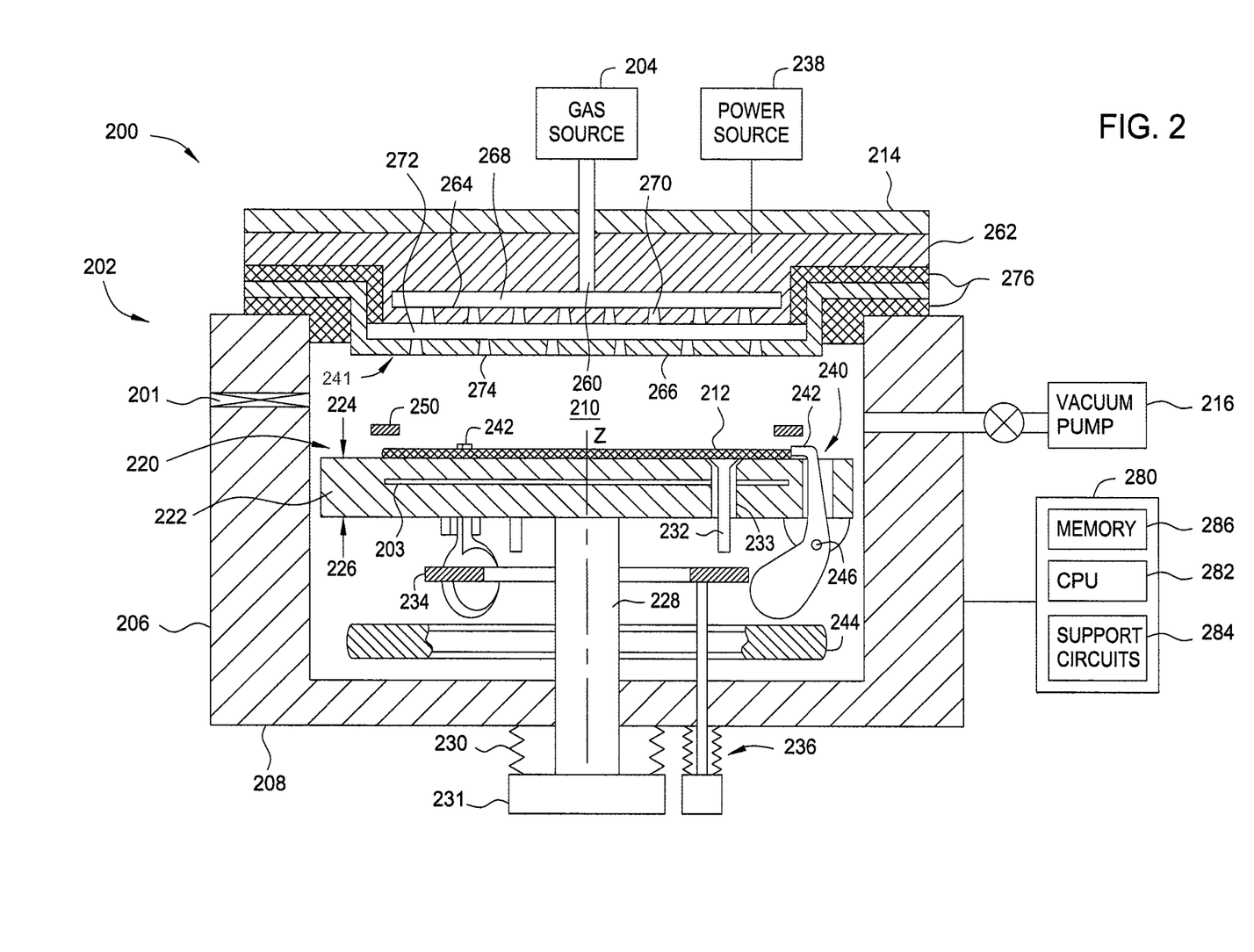
FIG. 2 is a schematic cross-sectional view of one embodiment of a PECVD system.

FIG. 2 is a schematic cross-sectional view of one embodiment of a PECVD system 200. The system 200 includes a process chamber 202 coupled to a gas source 204. The process chamber 202 has walls 206 and a bottom 208 that partially define a process volume 210. The process volume 210 may be accessed through a port 201 formed in the walls 206 that facilitate movement of a substrate 212 into and out of the process chamber 202. The walls 206 and bottom 208 may be fabricated from a unitary block of aluminum or other material compatible with processing. The walls 206 support a lid assembly 214. The process chamber 202 may be evacuated by a vacuum pump 216.

A temperature controlled substrate support assembly 220 may be centrally disposed within the process chamber 202. The support assembly 220 may support a substrate 212 during processing. In one embodiment, the support assembly 220 comprises a support base 222 made of aluminum that may encapsulate at least one embedded heater 203 operable to controllably heat the support assembly 220 and the substrate 212 positioned thereon to a predetermined temperature. In one embodiment, the support assembly 220 may operate to maintain the substrate 212 at a temperature between about 150 degrees Celsius to about 1000 degrees Celsius, depending on the deposition processing parameters for the material being deposited.

The support assembly 220 may have an upper side 224 and a lower side 226. The upper side 224 supports the substrate 212. The lower side 226 may have a stem 228 coupled thereto. The stem 228 couples the support assembly 220 to a lift system 231 that moves the support assembly 220 vertically between an elevated processing position and a lowered position that facilitates substrate transfer to and from the process chamber 202. The stem 228 additionally provides a conduit for electrical and thermocouple leads between the support assembly 220 and other components of the system 200. A bellows 230 may be coupled between the stem 228 and the bottom 208 of the process chamber 202. The bellows 230 provides a vacuum seal between the process volume 210 and the atmosphere outside the process chamber 202 while facilitating vertical movement of the support assembly 220.

To facilitate the transfer of the substrate 212, the support base 222 also includes a plurality of openings 233 through which lift pins 232 are movably mounted. The lift pins 232 are operable to move between a first position and a second position. The first position, shown in FIG. 2, allows the substrate 212 to rest on the upper side 224 of the support base 222. The second position (not shown) lifts the substrate 212 above the support base 222 so that the substrate 212 can be transferred to a substrate handling robot coming through the port 201. Upward/downward movements of the lift pins 232 may be driven by a movable plate 234 connected to an actuator 236.

The support base 222 may be electrically grounded such that RF power supplied by a power source 238 to a gas distribution plate assembly 241 positioned between the lid assembly 214 and the support base 222 (or other electrode positioned within or near the lid assembly of the chamber) may excite gases present in the process volume 210 between the support base 222 and the distribution plate assembly 241. The RF power from the power source 238 may be selected commensurate with the size of the substrate 212 to drive the chemical vapor deposition process.

The support assembly 220 further comprises a centering mechanism 240 operable to center the substrate 212 relative to a vertical reference axis Z perpendicular to the substrate support plane of the support base 222. The centering mechanism 240 comprises three or more movable centering fingers 242 positioned at a periphery of the support base 222, and an opposing plate 244 placed below the fingers 242. Each finger 242 is pivotally mounted on the support base 222 via a shaft 246. The opposing plate 244 and the support base 222 are relatively movable so that the opposing plate 244 may contact and pivot the fingers 242 in a release position and stay free from the fingers 242 in a centering position.

Figure 3A:
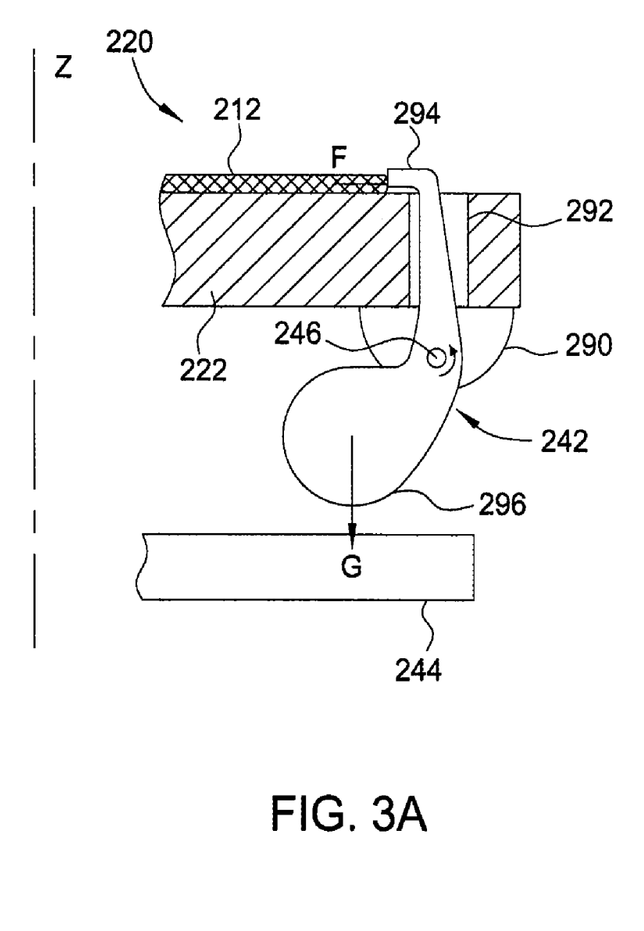
FIG. 3A is a partially enlarged cross-sectional view illustrating one centering finger of FIG. 2 in a centering position.
Figure 3B:
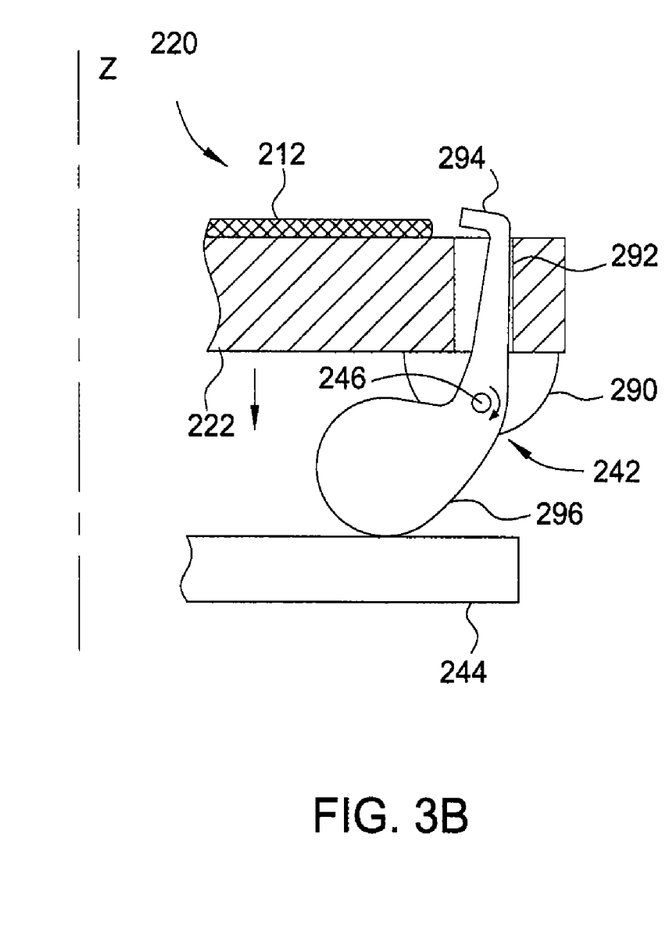
FIG. 3B is a partially enlarged cross-sectional view illustrating one centering finger of FIG. 2 in a disengaging position.

In one embodiment, the opposing plate 244 is stationary and the relative movement between the support base 222 and the opposing plate 244 is due to the vertical movement of the support base 222. The fingers 242 engage on the peripheral edge of the substrate 212 to center the substrate 212 when the support assembly 220 is in an elevated position as shown in FIG. 2 and FIG. 3A, and disengage from the peripheral edge of the substrate 212 when the support assembly 220 is in a lowered position as shown in FIG. 3B. Further details of the centering mechanism 240 and its operation will be described hereafter.

The process chamber 202 may additionally comprise a circumscribing shadow frame 250. The shadow frame 250 is configured to prevent deposition at the edge of the substrate 212 and support assembly 220 so that the substrate may not stick to the support assembly 220.

The lid assembly 214 provides an upper boundary to the process volume 210. The lid assembly 214 may be removed or opened to service the process chamber 202. In one embodiment, the lid assembly 214 may be fabricated from aluminum.

The lid assembly 214 may include an entry port 260 through which process gases provided by the gas source 204 may be introduced into the process chamber 202. A gas distribution plate assembly 241 may be coupled to an interior side of the lid assembly 214. The gas distribution plate assembly 241 includes an annular base plate 262 having a blocker plate 264 disposed intermediate to a faceplate (or shower head) 266. The blocker plate 264 provides an even gas distribution to a backside of the faceplate 266. The processing gas from the entry port 260 enters a first hollow volume 268 partially limited between the annular base plate 262 and the blocker plate 264, and then flows through a plurality of passages 270 formed in the blocker plate 264 into a second volume 272 between the blocker plate 264 and the faceplate 266. The processing gas then enters the process volume 210 from the second volume 272 through a plurality of passages 274 formed in the faceplate 266. The faceplate 266 is isolated via an insulator material 276. The annular base plate 262, blocker plate 264 and faceplate 266 may be fabricated from stainless steel, aluminum, anodized aluminum, nickel or any other RF conductive material.

The power source 238 applies a radio frequency (RF) bias potential to the annular base plate 262 to facilitate the generation of a plasma between the faceplate 266 and the support base 222. The power source 238 may include a high frequency RF power source ("HFRF power source") capable of generating an RF power at about 13.56 MHz, or a low frequency RF power source ("LFRF power source") generating an RF power at about 300 kHz. The LFRF power source provides both low frequency generation and fixed match elements. The HFRF power source is designed for use with a fixed match and regulates the power delivered to the load, eliminating concerns about forward and reflected power.

As shown in FIG. 2, a controller 280 may interface with and control various components of the substrate processing system. The controller 280 may include a central processing unit (CPU) 282, support circuits 284 and a memory 286.

The substrate 212 is transferred to the lift pins 232 in the chamber 202 by a conveyor that may be a robot or other transfer mechanism (not shown), and then placed on the upper side 224 of the support assembly 220 by moving downward the lift pins 232. As will be discussed below, the centering mechanism 240 then is operated to center the substrate 212 relative to the reference axis Z.

FIG. 3A is a partially enlarged cross-sectional view illustrating one centering finger 242 in a centering position. The centering finger 242 may be made in a single piece, or formed from the assembly of multiple component parts. Materials used for the finger 242 may include aluminum nitride, aluminum oxide, ceramics and similar materials or combinations thereof that have a low coefficient of thermal expansion and are resistant to the processing environment in the chamber 202. The finger 242 is pivotally mounted via the shaft 246 to a joint block 290 protruding from a lower side of the support base 222, and passes through a slot 292 in a peripheral region of the support base 222. An upper end portion 294 of the finger 242 extends above the support surface of the support base 222 to releasably contact with the peripheral edge of the substrate 212. A lower end portion 296 of the finger 242 is located eccentric from the shaft 246. The lower end portion 296 is weighted to bias the finger 242 by gravity action into a position to contact with the peripheral edge of the substrate 212. As shown, when the finger 242 loses contact with the opposing plate 244, which may be achieved by moving the support assembly 220 upward in one example of implementation, the gravity action G exerted on the lower end portion 296 thereby causes the finger 242 to pivot about the shaft 246, so that the upper end portion 294 moves radially inward to contact and exert a displacement force F on the peripheral edge of the substrate 212 in a direction toward the reference axis Z. As further discussed in FIG. 4, the three or more fingers 242 are evenly distributed along a periphery of the substrate 212 and coordinately contact and move the substrate 212. Consequently, the substrate 212 can be moved to a centered position relative to the reference axis Z.

It is worth noting that the thickness of the upper end portion 294 may be designed slightly higher than the top surface of the substrate 212. When the displacement force F is applied by the upper end portion 294, the peripheral edge of the substrate 212 can thereby be prevented from slipping over the upper end portion 294.

To release the substrate 212, FIG. 3B is a partially enlarged cross-sectional view illustrating the centering finger 242 in a disengaging position. The support base 222 may be moved downward so as to push the lower end portion 296 of the finger 242 into contact against the opposing plate 244, which counteracts the gravity action exerted on the lower end portion 296. As a result, the finger 242 is caused to pivot in an opposite direction so that the upper end portion 294 moves out of contact with the peripheral edge of the substrate 212.

Figure 4:
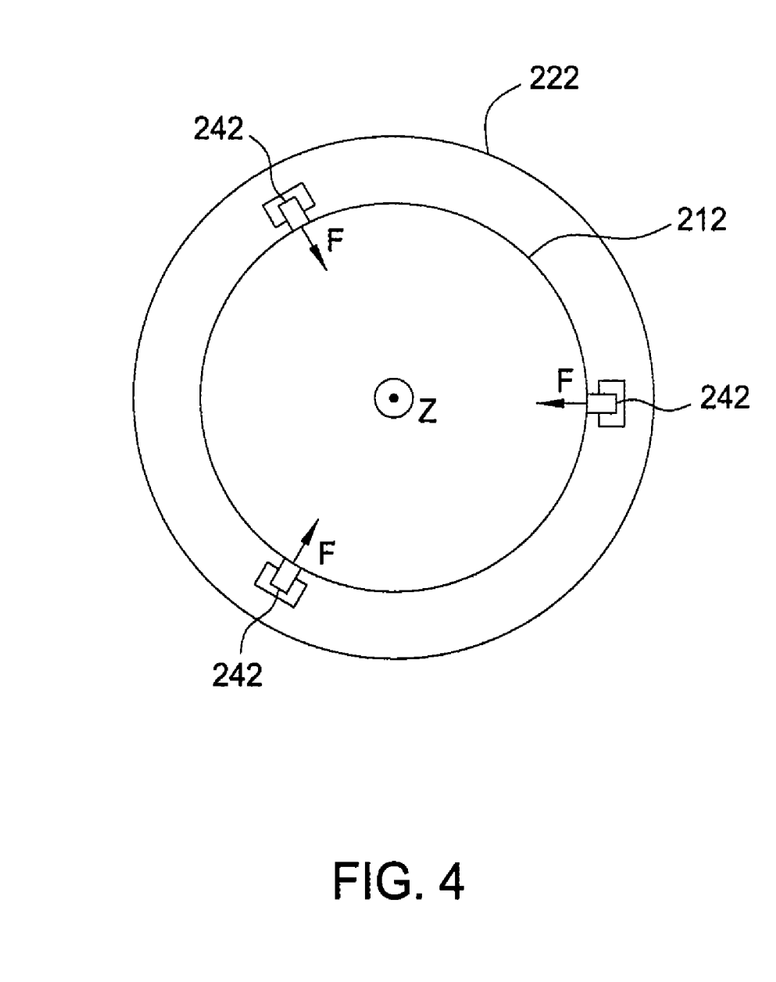
FIG. 4 is a simplified planar view illustrating one embodiment of a centering mechanism using 3 centering fingers to center a circular substrate.

As has been described above, the construction of the centering mechanism 240 thus is able to automatically center the substrate 212 by using the gravity action to bias each centering finger 242. The location of the centering fingers 242 on the support surface of the support assembly 220 may depend on the contour shape of the substrate to center. FIG. 4 is a simplified planar view of one embodiment in which three centering fingers 242 may be used to center a circular substrate 212 in place on the support base 222. The three centering fingers 242 are regularly spaced around a circle centered on the reference axis Z, and each finger 242 is able to apply a radial displacement force F to center the circular substrate 212. In other embodiments not shown, more centering fingers may be positioned in different arrangements to center other substrates of different contour shapes.

To effectively center the substrate 212, each centering finger 242 also needs to apply a sufficient amount of displacement force F to move the substrate 212, which is in relation to the mass included in the weighted lower end portion 296. In one implementation, the included mass may be in a range between about 10 grams to about 500 grams. Various ways may be implemented to include the proper mass in the lower end portion 296, such as by forming a massive lower end portion 296 of a larger size.

Figure 5:
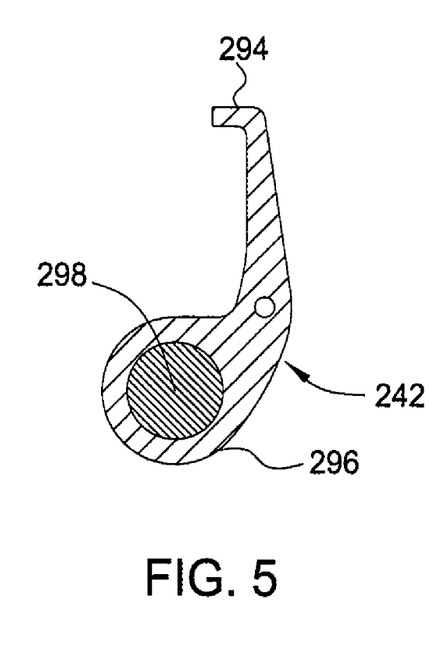
FIG. 5 is cross-sectional view showing one embodiment of a centering finger having an eccentric weighed portion.

FIG. 5 illustrates a variant embodiment in which an embedded solid material 298 of a higher mass density may be used to form the weighted lower end portion 296 of the centering finger 242. Methods to embed the solid material 298 in the finger 242 may include, for example, sintering a ceramic material used for making the finger 242 around the solid material 298. The solid material 298 may be molybdenum or other suitable materials of a mass density higher than the surrounding material used for the finger 242. In implementations that may impose limits on the size of the weighted lower end portion 296, the use of the embedded material 298 of a higher mass density allows to effectively increase the mass of the weighted lower end portion 296 without increasing its size.

While the foregoing embodiments illustrate certain specific ways to implement and operate the centering mechanism, many variations may be envisioned. For examples, in alternate embodiments described hereafter, other constructions may be implemented for each centering finger.

Figure 6A:
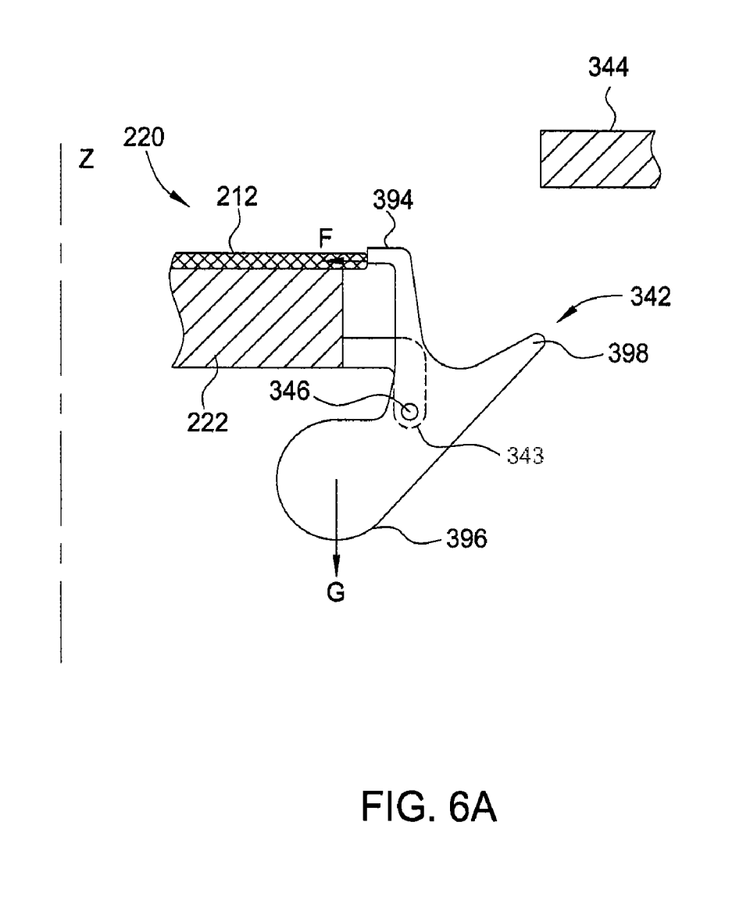
FIG. 6A is partial cross-sectional view illustrating another embodiment of a centering finger in a centering position.
Figure 6B:
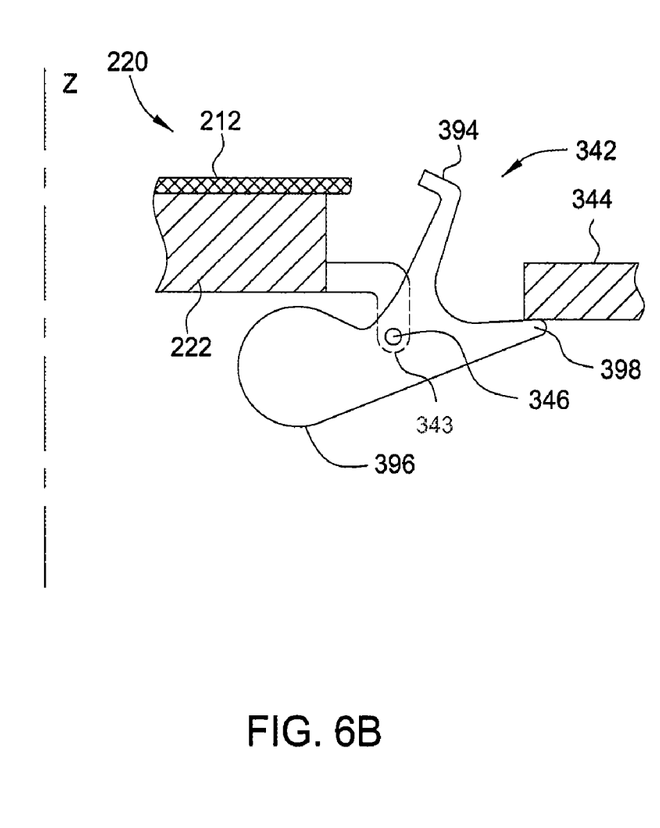
FIG. 6B is a partial cross-sectional view showing the centering finger of FIG. 6A in a disengaging position.

FIGS. 6A and 6B are partial cross-sectional views illustrating another embodiment of a centering finger 342. The centering finger 342 is pivotally mounted to a bracket 343, which extends out of an outer boundary of the support base 222, via a shaft 346. The support surface of the support base 222 may be smaller than the surface area of the substrate 212, so that a peripheral portion of the substrate 212 in place on the support base 222 is free of support contact. Like the embodiments described above, the finger 342 includes an upper end portion 394 adapted to contact with the peripheral edge of the substrate 212, and a weighted lower end portion 396 eccentric from the shaft 346 to bias the finger 342 into a position against the peripheral edge of the substrate 212. In addition, the finger 342 includes a distal prong 398 that is opposite the lower end portion 396 relative to the shaft 346, and is arranged below an opposing plate 344. As shown in FIG. 6A, to center the substrate 212, the lower end portion 396 of the centering finger 342 is subject to the gravity action G that biases the finger 342 and causes the upper end portion 394 to apply the displacement force F on the peripheral edge of the substrate 212.

As shown in FIG. 6B, to disengage the upper end portion 394 from the peripheral edge of the substrate 212, the support assembly 220 may be moved upward so that the distal prong 398 comes into contact with the opposing plate 344. As the support assembly 220 moves further upward relative to the opposing plate 344, the gravity action on the lower end portion 396 is overcome and the finger 342 rotates about the shaft 346 to disengage the upper end portion 394 from the peripheral edge of the substrate 212. In one embodiment, the finger 342 may be released during processing upon centering, thus preventing undesired deposition on the upper end portion 394, and reducing non-uniformity of the process due to the presence of the finger 342. It is worth noting that instead of moving the support assembly 220 carrying the finger 342 relative to the opposing plate 344, alternate embodiments may design the opposing plate 344 movable relative to the support assembly 220 to contact the distal prong 398 and cause the upper end portion 394 to disengage from the substrate 212.

Figure 7:
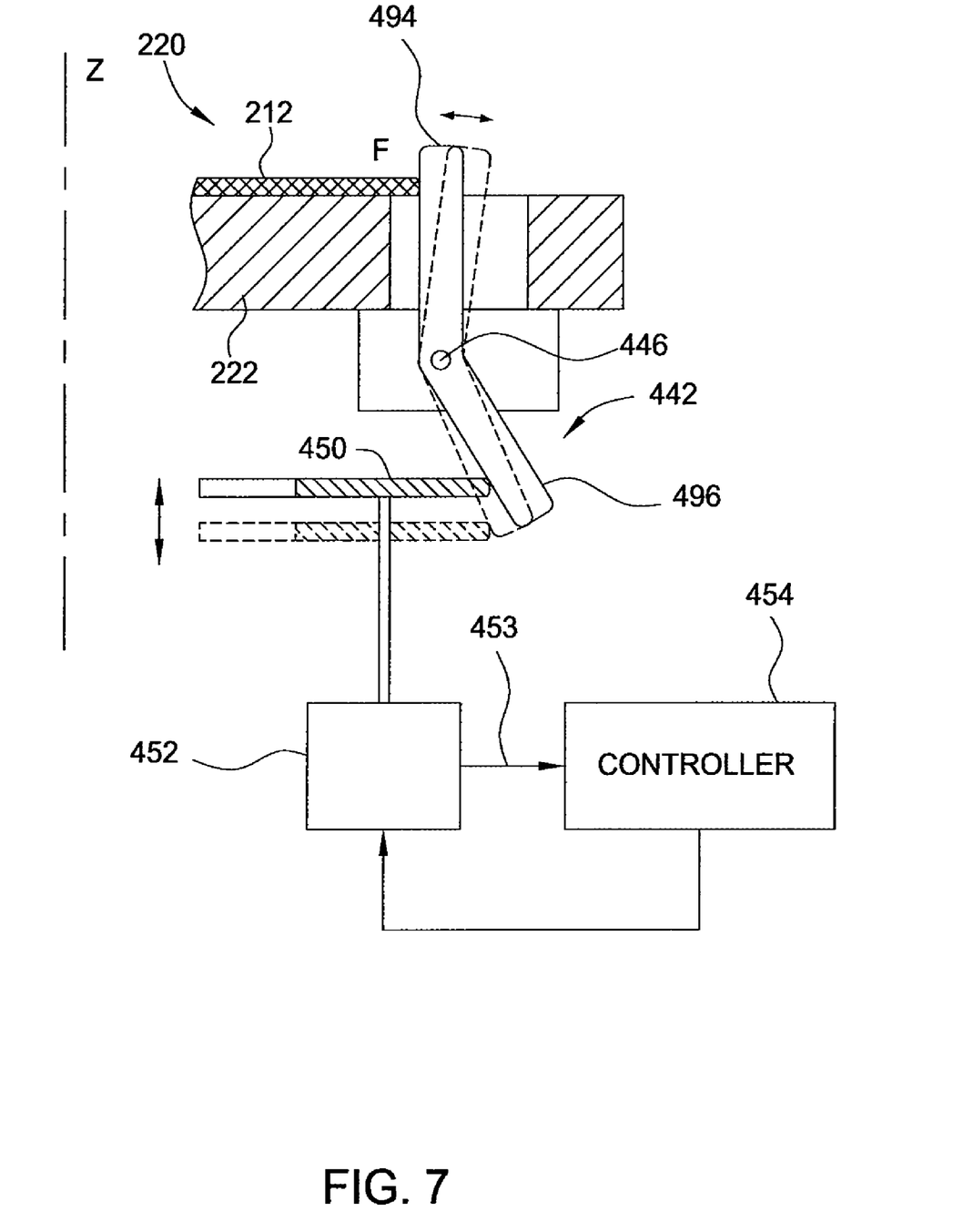
FIG. 7 is a partial cross-sectional view showing still another embodiment of a centering finger.

FIG. 7 is a partial cross-sectional view illustrating another variant embodiment of a centering finger 442. Like the previous embodiments, the centering finger 442 is pivotally mounted on the support base 222 via a shaft 446. The centering finger 442 includes an upper end portion 494 adapted to contact with the peripheral edge of the substrate 212, and a weighted lower end portion 496 eccentric from the shaft 446 to bias the finger 442 under the gravity action. However, unlike the previous embodiments, the eccentricity of the lower end portion 496 relative to the shaft 446 is configured to bias the finger 442 into a position that disengages the upper end portion 494 from the peripheral edge of the substrate 212. To center the substrate 212, an opposing plate 450 that is coupled to a servo or step motor 452 and a controller 454 is controllably moved to interact with the finger 442. More specifically, the opposing plate 450 moves upward to push on the lower end portion 496 and cause the finger 442 to pivot about the shaft 446 and leave the biased position. The controller 454 receives an operation signal 453 (please add this to the drawing) from the motor 452, and accordingly issues a control signal to the motor 452 to control the output of the motor 452. The controlled range of upward motion of the opposing plate 450 thereby causes a controlled displacement of the upper end portion 494 to move and center the substrate 212.

In one embodiment, the controller 454 monitors the force applied to a substrate being centered by each centering finger 442 using the operation signal 453. In one embodiment, the operation signal 453 may be torque of the motor 452. When the operation signal 453, e.g. torque of the motor 452, reaches a critical value which indicates the force applied to the substrate being centered reaches a predetermined amount, the substrate is adequately centered. The controller 454 then stops to motor 452 to avoid over centering, thus, preventing damages to the substrate.

To disengage the upper end portion 494 from substrate 212, the opposing plate 450 moves downward, which causes the finger 442 to recover the biased position under the gravity action applied on the weighted lower end portion 496.

Figure 8:
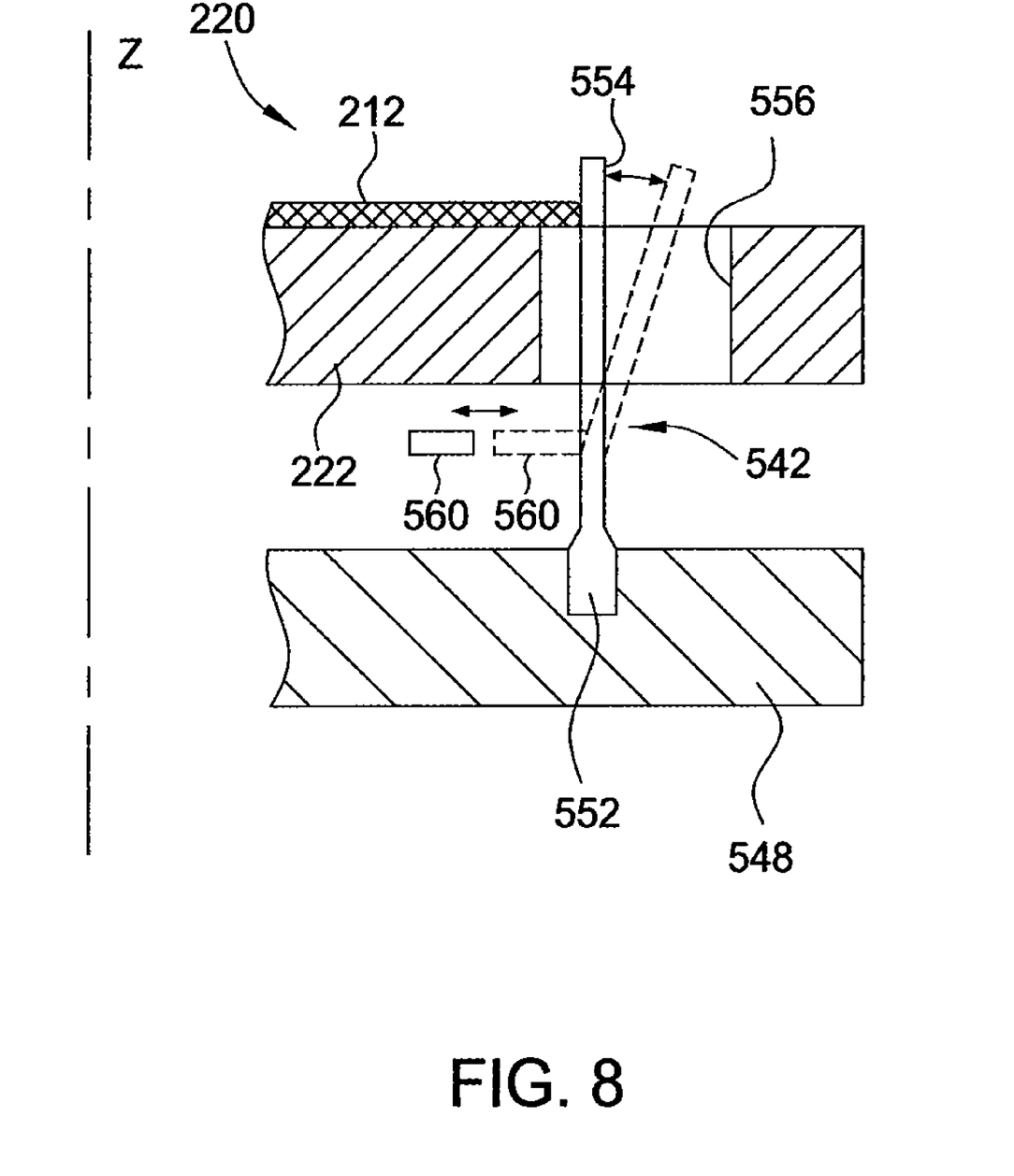
FIG. 8 is a partial cross-sectional view showing yet another embodiment of a centering finger.

FIG. 8 is a partial cross-sectional view illustrating yet another embodiment of a centering finger 542. The centering finger 542 is formed as a resilient member, such as an elongated ceramic spring, that has a first end 552 fixedly mounted on a frame 548 separate from the support base 222, and a second end 554 extending above the support base 222 through an opening 556 formed in the support base 222. To center the substrate 212 relative to the reference axis Z, the finger 542 is biased to push on the peripheral edge of the substrate 212 in a direction toward the reference axis Z. To disengage the finger 542 from the contact with the substrate 212, an opposing actuator 560 may be controllably moved to interact with the finger 542. The actuator 560 may come into contact with the finger 542, and push on the finger 542 that thereby deflects away from its biased position to disengage from the substrate 212.

As has been described above, the centering apparatus provided in the process chamber is thus able to center a substrate in place on a support assembly in an effective and accurate manner. Consequently, semiconductor processes such as film deposition and etching steps can be precisely performed on the substrate.

While the foregoing is directed to certain embodiments of the present invention, other and further embodiments of the invention may be devised without departing from the basic scope thereof, and the scope thereof is determined by the claims that follow.

What is claimed is:

1. An apparatus for positioning a substrate in a processing chamber, comprising:
    a substrate support having a support surface adapted to receive the substrate; and
    a plurality of centering members configured to center the substrate relative to a reference axis substantially perpendicular to the support surface, wherein the plurality of the centering members are movably disposed along a periphery of the support surface, each of the plurality of centering members is pivotally mounted on the substrate support via a shaft, and each of the plurality of centering members comprises:
        a first end portion configured to contact a periphery edge of the substrate, wherein the first end portion is movable between a first position and a second position, a movement from the first position to the second position causes the centering member to move out of contact with the peripheral edge of the substrate, and a movement from the second position to the first position causes the centering member to contact the periphery edge of the substrate; and
        a weighted portion having an embedded mass of solid material with high density, wherein the first end portion and weighted portion are disposed on opposing sides of the shaft, and the weighted portion is configured to bias the first end portion towards the first position by gravity.

2. The apparatus of claim 1, further comprising an opposing member configured to interact with each of the plurality of centering member to move the first end portion.

3. The apparatus of claim 2, wherein the opposing member is configured to move the first end portion of each of the plurality of centering members towards the second position, and each of the plurality of centering member is independently biased towards the first position, and combination of biasing forces from the plurality of centering members centers the substrate relative to the reference axis.

4. The apparatus of claim 1, wherein the embedded mass is between about 10 grams to about 500 grams.

5. The apparatus of claim 2, wherein the opposing member comprises a movable member coupled to a motor.

6. The apparatus of claim 1, wherein each of the centering members is formed by sintering a material including ceramic, aluminum nitride, aluminum oxide, aluminum, and combinations thereof around the embedded mass.

7. The apparatus of claim 1, wherein the embedded mass comprises molybdenum or other suitable material having a higher density than sintered material of the centering members.

8. A method for centering a substrate in a processing chamber, comprising:
- providing a substrate support having a support surface adapted to receive a substrate;
- providing a plurality of centering members disposed along a circle centered at a reference axis substantially perpendicular to the support surface, wherein each centering member comprises an end portion configured to contact a periphery edge of a substrate, and the end portion is radially movable towards and away from the reference axis;
- moving the end portion of each centering members radially outwards and away from the reference axis;
- placing the substrate on the substrate support, wherein the substrate and the centering members do not contact;
- moving the end portion of each centering member to radially inwards to contact with a peripheral edge of the substrate for centering the substrate by gravity force of a weighted portion of each centering member; and
- positioning the substrate with the end portions of the centering members.

9. The method of claim 8, wherein moving the end portion of each centering members radially outwards and moving the end portion of each centering members radially inwards comprise pivoting each of the centering members about a shaft mounted on the substrate support.

10. The method of claim 9, wherein moving the end portion of each centering member radially inwards comprises releasing the weighted portion eccentrically coupled to the centering member from the shaft, and moving the end portion of each centering member radially outwards comprising lifting the weight portion with an opposing member.

11. The method of claim 10, wherein the weighted portion comprises an embedded mass between about 10 grams to about 500 grams.

12. The method of claim 11, wherein the embedded mass has a higher density than a surrounding material of the centering member.

13. The method of claim 9, wherein pivoting the centering members comprises interacting the centering members with an opposing member.

14. An apparatus for positioning a substrate in a processing chamber, comprising:
- a substrate support having a support surface adapted to receive the substrate;
- a plurality of centering members configured to center the substrate about a center axis of the support surface, wherein each of the plurality of centering members comprises:
  - a finger having an upper end portion and a lower end portion, wherein the upper end portion is configured to contact a periphery edge of the substrate, the upper end portion is movable between a first position and a second position, and a movement from the second position to the first position causes the centering member to contact and push the substrate disposed on the support surface; and
  - an embedded solid material disposed in the lower end portion of the finger, wherein the embedded solid material has a higher density than a material of the finger, and the upper end portion of the finger is biased towards the first position by gravity of the lower end portion; and
- an opposing member configured to interact with each centering member to counteract the gravity of the lower end portion of each finger.

15. The apparatus of claim 14, wherein each of the centering members is pivotally mounted to the substrate support via a shaft, the upper end portion of each finger extends above the support surface, and the lower end portion of each finger is located eccentric from the shaft to bias the finger by gravity.

16. The apparatus of claim 15, further comprising a joint block protruding from a lower side of the substrate support, wherein the centering members are mounted to the joint block via the shafts.

17. The apparatus of claim 14, wherein the plurality of centering fingers are evenly distributed along a periphery of the support surface.

18. The apparatus of claim 14, wherein each finger is formed by sintering a ceramic material around the embedded solid material.

19. The apparatus of claim 18, wherein the fingers are formed from a material including ceramic, aluminum nitride, aluminum oxide, aluminum, and combinations thereof.

20. The apparatus of claim 15, wherein the substrate support moves vertically relative to the opposing member.

* * * * *

UNITED STATES PATENT AND TRADEMARK OFFICE
CERTIFICATE OF CORRECTION

| | | |
|---|---|---|
| PATENT NO. | : 7,922,440 B2 | |
| APPLICATION NO. | : 12/171594 | |
| DATED | : April 12, 2011 | |
| INVENTOR(S) | : Du Bois et al. | |

It is certified that error appears in the above-identified patent and that said Letters Patent is hereby corrected as shown below:

In the Claims:

Column 9, Claim 7, Line 2, please delete "haying" and insert --having-- therefor.

Signed and Sealed this
Twelfth Day of July, 2011

David J. Kappos
*Director of the United States Patent and Trademark Office*